Sept. 1, 1959 J. B. LITTLE ET AL 2,902,629

PRINTED CIRCUIT CONNECTION AND METHOD OF MAKING SAME

Filed Nov. 22, 1954

INVENTORS
JOHN B. LITTLE
BYRON E. PHELPS
BY
Ralph C. Dustin
ATTORNEY

United States Patent Office 2,902,629

Patented Sept. 1, 1959

2,902,629

PRINTED CIRCUIT CONNECTION AND METHOD OF MAKING SAME

John B. Little and Byron E. Phelps, Poughkeepsie, N.Y., assignors to International Business Machines Corporation, New York, N.Y., a corporation of New York Application November 22, 1954, Serial No. 470,353

4 Claims. (Cl. 317—101)

This invention relates to improved methods of connecting component leads to printed wiring.

In circuits and apparatus involving printed wiring it is often necessary to connect the leads of circuit components to the printed wiring. One method of making all such connections simultaneously on an individual piece of apparatus is the dip soldering technique. In this type of process the entire side of the assembly containing the printed wiring, with the leads from the circuit components projecting through at various points, can be dipped face down in a bath of molten solder and removed after a brief period of immersion. This results in coating the conductors with solder and soldering all the connections at the same time. In efficient printed circuit design it is often desirable to use the component lead connection to provide a connection to printed wiring patterns located on both sides of the mounting material for the printed circuit. However, to use the dip soldering technique to make a component lead connection to printed wiring on both sides of the mounting material for a printed circuit, it has been found that either the component must be subjected to the effects of heat in the dipping operation or that the components must be mounted away from the surface of the mounting material. This invention is directed to a method of making connections of component leads to printed wiring on both sides of a printed circuit panel in a single dip soldering operation wherein only the side of the printed circuit panel opposite to the mounting side for the components is immersed in the solder bath.

Accordingly it is an object of this invention to provide an improved component connecting technique for printed circuits.

Another object of this invention is to provide a method of connecting printed wiring on both sides of a printed circuit panel to a component lead in one dip soldering operation.

A related object of this invention is to provide a method of compensating for differences in component lead diameter and printed circuit panel hole diameter in printed circuit assembly operations.

Still another related object of this invention is to provide a method of accurately spacing components with respect to the printed circuit panel surface in printed circuit assembly operations.

Other objects of the invention will be pointed out in the following description and claims and illustrated in the accompanying drawings, which disclose, by way of example, the principle of the invention and the best mode, which has been contemplated, of applying that principle.

In the drawings:

The invention will be described with reference to the accompanying drawing in which—

In general, the process of this invention comprises providing at the point of component connection, two closely adjacent surfaces capable of being wetted by the solder so that the solder is drawn by "wick-like" or capillary action along the two closely adjacent surfaces to a point above the level of the solder bath.

The degree of proximity of the two adjacent surfaces may vary from touching each other to a separation in the vicinity of .004 in. Two of the factors influencing the amount of distance between the adjacent surfaces that can be tolerated and still sustain the wick-like action are the heat conductivity of the material and the surface tension of the connecting material such a solder. Accordingly the term adjacent could best be defined as sufficiently proximate to sustain the wick-like action.

Figures 1, 3:
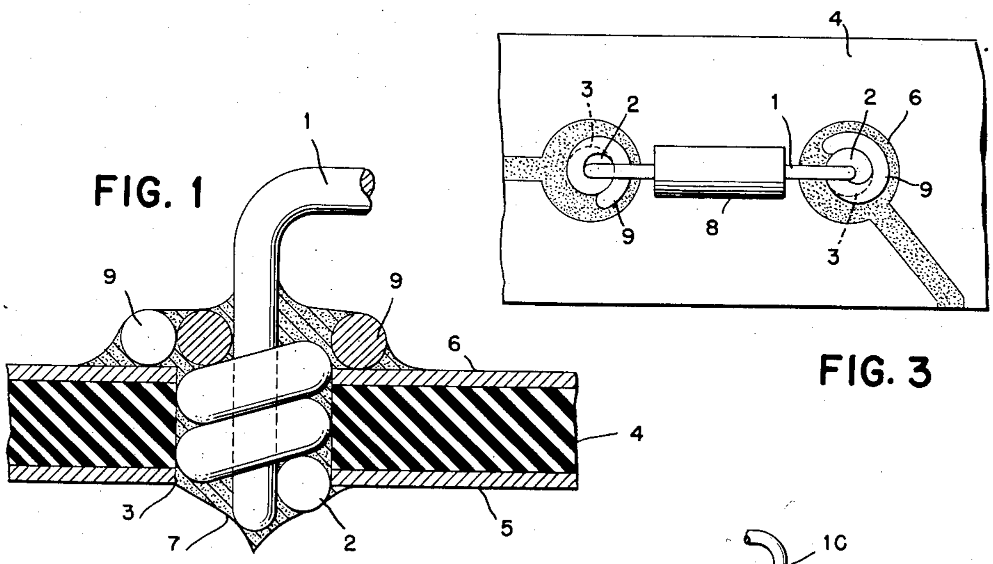
Figure 1 shows a cross sectional view of a component lead connected by the method of this invention.
Figure 3 shows a top view of the assembly in Figure 2.

In practicing this invention the two adjacent surfaces may be provided in any one of several ways one of which may be seen in Figure 1. Referring now to Figure 1 there is shown a component lead 1 around which has been wrapped a coiled wire 2. These are inserted in a hole 3 in printed circuit panel 4 having printed wiring patterns 5 and 6 on both sides thereof. Solder 7 is shown making continuous connection between component lead 1 and wiring patterns 5 and 6 on both sides of the panel 4 through the hole 3.

The connection of Figure 1 is produced by bringing the assembly into contact with a molten solder bath sufficiently to immerse the adjacent surfaces or "wick" ends and to coat the lower printed pattern. This may be seen in Fig. 2 wherein more than one lead 1 of a component 8 are assembled in the panel 4 and the assembly is shown contacting the solder 7. Referring to Figure 1, the molten solder 7 wets the adjacent surfaces of the turns of the coil 2 and travels by wick-like or capillary action up the coil 2 and makes contact with the upper wiring pattern 6. Hence, a connection is formed between the component lead 1, the lower wiring pattern 5 and the upper wiring pattern 6 in one dip soldering operation wherein the circuit panel 4 was immersed only deep enough into the molten solder 7 to cover the lower extremity of the coil 2 and lead 1 combination. It is necessary in making contact with the solder bath only to place the adjacent surfaces sufficiently deep for good heat conduction since once the adjacent surfaces reach the necessary temperature they are wetted by the solder and the "wick-like" action takes place.

Figure 2:
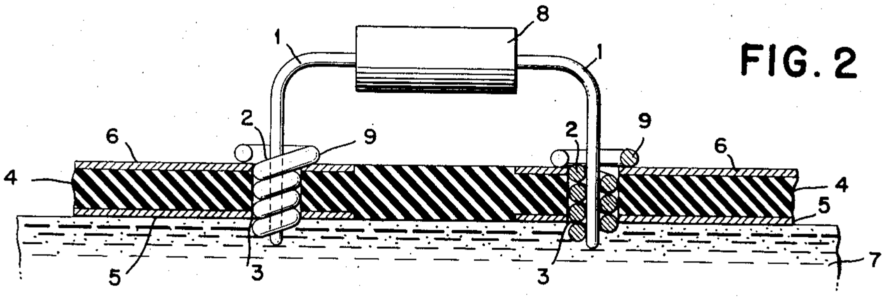
Figure 2 shows a side view of a component assembled according to this method contacting the solder bath.

In connection with component assembly in printed circuit work it has been found advantageous to be able to insure a close fit of the component lead in the hole through the circuit panel and to be able to position the component at a fixed distance from the surface of the panel. Referring to Figure 1 an advantage is gained using this method in that the diameter of the wire in coil 2 may be varied to compensate for variations in diameter of lead 1 and hole 3. Since, lead diameters fall into main groups .020 in. diameter and .040 in. diameter it is possible with two coil wire sizes to insure a fit in a given panel hole for most components. Further, by proper selection of the coil wire size, odd size leads may be adapted to most panel holes. Another advantage is gained by placing an extra turn of wire on the coil. This extra turn is shown in Figures 1, 2, 3 and 5 as turn 9 on coil 2. Referring to Figure 2, the coil 2 frictionally grips the lead 1 and the turn 9 acts as a shoulder which bears on the upper surface of the panel 4, facilitates connection to wiring pattern 6 and positions the component 8 with respect to the surface of panel 4. Referring to the top view of the assembly of Figure 2 as shown in Figure 3 the extra turn 9 is shown bearing on the upper surface of panel 4 and wiring pattern 6 extending beyond hole 3.

It will be noted that the component 8 may be supported in any position above the panel 4 during the soldering process. If desired, the component may be positioned so that it engages the upper surface of the panel. When positioned in this manner, the component is not damaged during soldering since the panel is only partially dipped into the solder, as shown in Figure 2. The wick action causes the solder to flow upwardly on the terminals to effect a soldering of the latter to circuits at the upper surface of the panel. If this wick action was not obtained, the panel would have to be dipped below the surface of the solder to cause a soldering action between the leads and the upper circuits. This would make it necessary that the components be spaced from the panel to avoid damage by the solder.

Figure 6:
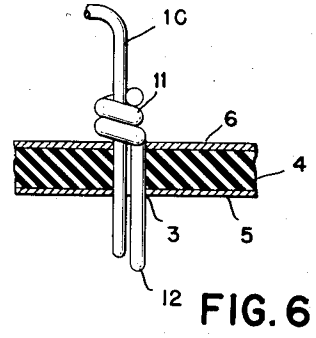
Figure 6 shows a method of applying a coil of wire to space the component and permit connection by this method.
Figure 4:
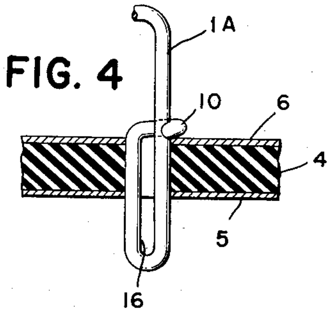
Figure 4 shows a method of bending the component lead itself to provide connection by the method of this invention.
Figure 5:
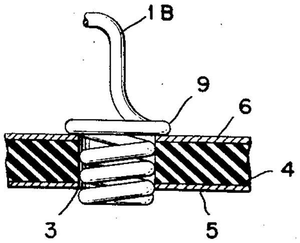
Figure 5 shows a method of coiling the component lead itself to adjust for panel hole size.

The two adjacent surfaces may also be provided as shown in Figures 4, 5 and 6. In Figure 4 the wick action is obtained by providing a component with a lead 1A which is bent back upon itself. Some hole size and lead diameter variation may be taken up by the separation 16 between the parts of the lead 1A within the limits to still permit capillary action. The end 10 of the lead 1A is coiled around the straight portion to form a shoulder and to position the component with respect to the panel surface, but more importantly, to continue the wick action to the upper pattern.

In Figure 5 an embodiment is shown wherein a component lead 1B is shown coiled such that the outside diameter of the coil fits snugly in the hole 3 and the wick action is obtained by the solder travelling up the adjacent turns of the coil.

In Figure 6 another embodiment is illustrated wherein a separate wire 11 is coiled around a component lead 1C to form a shoulder which positions the component with respect to the upper surface of panel 4 and facilitates connection to upper wiring pattern 6 and the wick action is obtained by permitting a straight section of the wire 12 to lie adjacent to the lead 1C in the hole 3.

While there have been shown and described and pointed out the fundamental novel features of the invention as applied to some preferred embodiments it will be understood that various omissions and substitutions and changes in the form of details of the device illustrated and in its operation may be made by those skilled in the art without departing from the spirit of the invention. For example, the coiling of the component leads and coils of wire used may be done by hand or by tools developed for the purpose; also the wick like capillary action is not limited to the use of solder as the connecting material as other connecting materials such as lead may be used. Also round wire need not be used, since any forms providing wick-action will be suitable. It is the intention therefore to be limited only as to the scope of the following claims.

What is claimed is:

1. A printed circuit connection comprising a quantity of printed circuit backing material having a hole extending therethrough from one side to the other of a first size, a component lead having a diameter of a second size smaller than said first size extending through said hole, a first printed conductor pattern on one side of said backing material, a second printed conductor pattern on the opposite side of said backing material, a coil of wire around said component lead and frictionally gripping same, said coil being formed of wire having a diameter selected to permit a snug fit between said hole and said component lead, said coil also having an extended turn at one of the ends thereof, and conductive material making connections between said first and said second printed conductor patterns said coil and said component lead.

2. A printed circuit connection comprising a printed circuit backing panel, having a hole of a first size extending through it from one side to the other, a first printed wiring pattern on one side of said panel, intersecting said hole, a second printed wiring pattern on the opposite side of said panel intersecting said hole, a component lead of a second size smaller than said first size extending through said hole, said lead being coiled to fit snugly inside said hole and to provide a continuous capillary action path from one side of said panel to the opposite side, and conductive material applied in a molten state making connections between said first and said second printed wiring pattern and said component lead.

3. A printed circuit connection connecting a component to a printing wiring pattern, said connection comprising a printed circuit panel including at least one printed wiring pattern thereon, a hole through said panel intersecting said printed wiring pattern, a component wire lead terminal having at least two linear portions disposed in said hole with their length dimensions extending through said hole each in mutual bearing relationship with the walls of said hole, said lead terminal further comprising a portion with a diameter greater than the diameter of said hole and resting on the panel surface margin surrounding said hole, and electrically conductive material applied in a molten state making connection between said printed wiring pattern and said component lead, said lead, printed wiring pattern and the portion of said lead with the diameter greater than said hole being wettable by said electrically conductive material and secured thereby into an integral joint.

4. The printed wiring connection of claim 3 wherein said two linear portions of said wire lead terminal are unitary.

References Cited in the file of this patent

UNITED STATES PATENTS

| | | |
|---|---|---|
| 2,066,876 | Carpenter | Jan. 5, 1937 |
| 2,244,009 | Hiensch | June 3, 1941 |
| 2,433,384 | McLarn | Dec. 30, 1947 |
| 2,473,879 | Guarnaschelli | June 21, 1949 |
| 2,474,988 | Sargrove | July 5, 1949 |
| 2,607,821 | Van Arsdell | Aug. 19, 1952 |
| 2,695,351 | Beck | Nov. 23, 1954 |
| 2,700,150 | Wales | Jan. 18, 1955 |
| 2,707,272 | Blitz | Apr. 26, 1955 |